(12) United States Patent
Dickey

(10) Patent No.: US 11,404,354 B2
(45) Date of Patent: Aug. 2, 2022

(54) POWER CONTROL MODULES

(71) Applicant: Hamilton Sundstrand Corporation, Charlotte, NC (US)

(72) Inventor: John A. Dickey, Caledonia, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 29 days.

(21) Appl. No.: 17/006,315

(22) Filed: Aug. 28, 2020

(65) Prior Publication Data

US 2021/0050283 A1 Feb. 18, 2021

Related U.S. Application Data

(62) Division of application No. 16/175,231, filed on Oct. 30, 2018, now Pat. No. 10,763,193.

(51) Int. Cl.
| | |
|---|---|
| *H01L 23/495* | (2006.01) |
| *H01L 21/50* | (2006.01) |
| *H01L 23/367* | (2006.01) |
| *H01R 43/02* | (2006.01) |

(52) U.S. Cl.
CPC ........ *H01L 23/49531* (2013.01); *H01L 21/50* (2013.01); *H01L 23/367* (2013.01); *H01R 43/02* (2013.01)

(58) Field of Classification Search
CPC .. H01L 23/49531; H01L 21/50; H01L 23/367
See application file for complete search history.

(56) References Cited

U.S. PATENT DOCUMENTS

| | | | |
|---|---|---|---|
| 6,538,405 B1 | 3/2003 | Brzozowski et al. | |
| 7,070,084 B2 | 7/2006 | Waldvogel et al. | |
| 9,101,082 B1 | 8/2015 | Dorenkamp et al. | |
| 11,107,746 B2 * | 8/2021 | Kawashima | ............ H01L 24/83 |
| 2005/0263318 A1 | 12/2005 | Yoshioka | |

(Continued)

FOREIGN PATENT DOCUMENTS

WO 2010001300 1/2010

OTHER PUBLICATIONS

Rietjens, A., "Microcontroller-Driven NICD Battery Charger", Elektor Electronics, Elektor Electronics GB, vol. 19, No. 215, Oct. 1, 1993, pp. 30-36.

(Continued)

*Primary Examiner* — Nathan W Ha
(74) *Attorney, Agent, or Firm* — Locke Lord LLP; Scott D. Wofsy; Alicia J. Carroll

(57) ABSTRACT

A power control module includes a power device having a first side and a second side opposite from the first. The power control module includes a printed wiring board (PWB) spaced apart from the first side of the power device. The PWB is electrically connected to the power device. A heat sink plate is soldered to a second side of the transistor for heat dissipation from the transistor. The PWB and/or the heat sink plate includes an access hole defined therein to allow for access to the transistor during assembly. A method of assembling a power control module includes soldering at least one lead of a power device to a printed wiring board (PWB), pushing the power device toward a heat sink plate, and soldering the power device to the heat sink plate.

8 Claims, 1 Drawing Sheet

(56) References Cited

U.S. PATENT DOCUMENTS

| | | | | |
|---|---|---|---|---|
| 2006/0055432 | A1* | 3/2006 | Shimokawa | H01L 24/41 327/5 |
| 2008/0087913 | A1* | 4/2008 | Otremba | H01L 24/40 257/177 |
| 2008/0173099 | A1* | 7/2008 | Ban | G01F 1/684 73/861 |
| 2008/0198557 | A1* | 8/2008 | Lim | H05K 7/205 361/719 |
| 2009/0086455 | A1* | 4/2009 | Sakamoto | H05K 1/144 361/796 |
| 2010/0302729 | A1 | 12/2010 | Tegart et al. | |
| 2015/0194373 | A1* | 7/2015 | Otremba | H01L 24/14 257/676 |
| 2015/0255367 | A1* | 9/2015 | Nakahara | H01L 23/3735 257/712 |
| 2015/0311815 | A1 | 10/2015 | Nedic et al. | |
| 2016/0014927 | A1* | 1/2016 | Chen | H05K 7/2039 361/720 |
| 2016/0021789 | A1 | 1/2016 | Negishi et al. | |
| 2016/0088720 | A1 | 3/2016 | Willis | |
| 2016/0133534 | A1 | 5/2016 | Lopez et al. | |
| 2016/0141275 | A1 | 5/2016 | Bono et al. | |
| 2016/0324031 | A1 | 11/2016 | Fujiwara | |
| 2017/0110837 | A1 | 4/2017 | Taniguchi et al. | |
| 2017/0117204 | A1 | 4/2017 | McPartlin et al. | |
| 2017/0164518 | A1 | 6/2017 | Morgan et al. | |
| 2017/0170157 | A1 | 6/2017 | Masuda et al. | |
| 2018/0022220 | A1 | 1/2018 | Xu et al. | |
| 2019/0052184 | A1 | 2/2019 | Liu et al. | |
| 2020/0101549 | A1 | 4/2020 | Hutzler et al. | |

OTHER PUBLICATIONS

Extended European Search Report dated Apr. 3, 2020, issued during the prosecution of European Patent Application No. EP 19205855.0.
European Communication Pursuant to Art. 94(3) EPC dated Dec. 8, 2021, issued during the prosecution of European Patent Application No. EP 19205855.0, 7 pages.

* cited by examiner

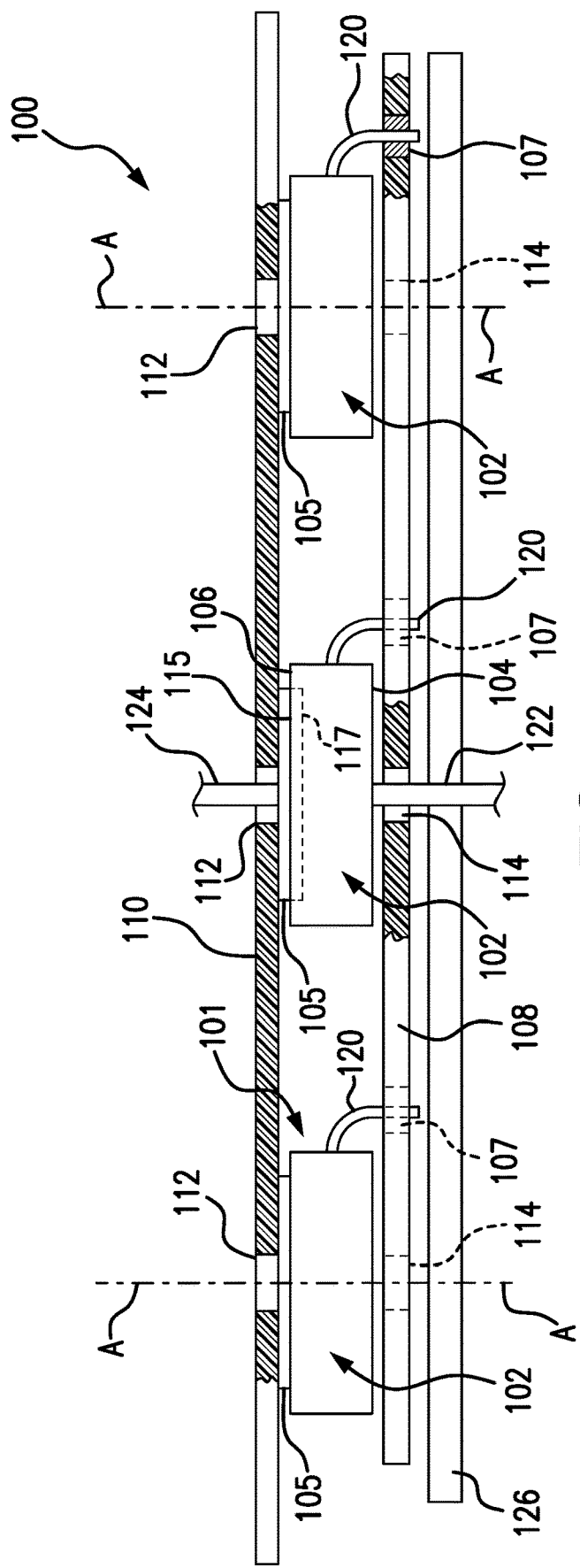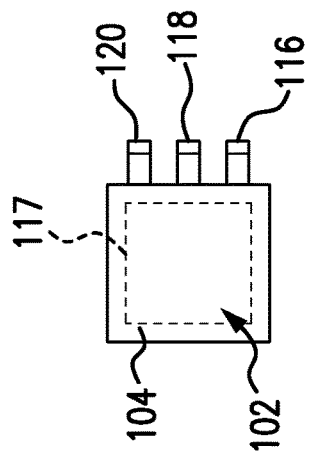

POWER CONTROL MODULES

CROSS-REFERENCE TO RELATED APPLICATION

This application is a divisional application of U.S. patent application Ser. No. 16/175,231 filed on Oct. 30, 2018, which is incorporated herein by reference in its entirety.

BACKGROUND OF THE DISCLOSURE

1. Field of the Disclosure

The present disclosure relates to power control modules and more particularly to heat dissipation in power control modules.

2. Description of Related Art

Power control modules, e.g. Solid State Power Controller (SSPC) modules, can be used instead of conventional electro-mechanical relays and circuit breakers for power distribution in a number of different applications. Some SSPC modules are widely used in aircraft secondary distribution systems. A typical SSPC a power semiconductor device, e.g. a power transistor such as a metal-oxide-semiconductor field-effect transistor (MOSFET), and control circuitry are typically contained in a printed wiring board (PWB). A plurality of SSPC modules are often assembled onto a common PWB that includes multiple control circuit channels.

Traditionally, all the power transistors, e.g. MOSFETs, and control circuit channels are all on a single PWB. This is convenient for assembly but results in thermal dissipation being limited to whatever the surface area of that PWB allows for. This also means that the SSPC have been thermally limited to the energy that can be dissipated from the PWB. Previous heat sink methods have faced manufacturing inefficiencies due to manual operations required.

Such conventional methods and systems have generally been considered satisfactory for their intended purpose. However, there is still a need in the art for improved methods of heat dissipation in SSPC modules, improved methods of manufacturing for SSPC modules with heat sinks, and improved module assemblies to facilitate such improved methods.

SUMMARY

A power control module includes a power device having a first side and a second side opposite from the first. The power control module includes a printed wiring board (PWB) spaced apart from the first side of the power device. The PWB is electrically connected to the power device. A heat sink plate is soldered to a second side of the transistor for heat dissipation from the transistor. The PWB and/or the heat sink plate includes an access hole defined therein to allow for access to the transistor during assembly.

In accordance with some embodiments, the access hole is a plate access hole defined in the heat sink plate to allow for soldering access during assembly. The plate access hole can be aligned with the second side of the power device. The access hole can be a PWB access hole defined in the PWB. The PWB access hole can be aligned with the first side of the power device. The PWB access hole and plate access hole can face towards one another across the power device. The PWB access hole can define a central axis. The PWB access hole and the plate access hole can be aligned such that the central axis of the PWB access hole extends through the plate access hole. The power device can be electrically connected to the PWB by at least one of a drain lead, a source lead or a gate lead. The power device can be an ISOTAB transistor. It is contemplated that the heat sink plate can be a copper plate heat sink.

In accordance with another aspect, a method of assembling a power control module includes soldering at least one lead of a power device to a PWB, pushing the power device toward a heat sink plate, and soldering the power device to the heat sink plate.

In accordance with some embodiments, soldering includes soldering at least one of a gate lead, a drain lead or a source lead. Pushing the power device toward the heat sink plate can include inserting a push pin through a PWB access hole and pushing the power device. Soldering the power device can include accessing the power device with a soldering tip through a plate access hole. Pushing and soldering can occur at the same time. Pushing the power device toward the heat sink plate can include inserting a push pin through the PWB access hole and pushing the power device from a first side. Soldering the power device can include accessing a second side of the power device with a soldering tip through the plate access hole. The second side of the power device can be opposite from the first side of the power device.

It is contemplated that the method can include aligning the power device with the PWB access hole. The method can include forming the at least one lead of the power device by bending the at least one lead. In accordance with some embodiments, the method includes aligning the PWB access hole with the plate access hole. The method can include moving the PWB and/or the heat sink plate with an automated X-Y table to align the PWB access hole and/or the plate access hole with at least one of a push pin or a soldering tip.

These and other features of the systems and methods of the subject disclosure will become more readily apparent to those skilled in the art from the following detailed description of the embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein:

FIG. 1 is a schematic side view of an exemplary embodiment of a power control module assembly constructed in accordance with the present disclosure, showing a plurality of power control modules each having a power control device (MOSFET) electrically connected to common PWB and mounted to a common copper plate heat sink, where the common PWB and common copper plate heat sink are shown in partial cross-section; and FIG. 2 is a schematic plan view of a top side of an exemplary embodiment of a MOSFET constructed in accordance with the present disclosure, showing drain, gate and source leads.

DETAILED DESCRIPTION

Reference will now be made to the drawings wherein like reference numerals identify similar structural features or aspects of the subject disclosure. For purposes of explanation and illustration, and not limitation, a partial view of an exemplary embodiment of a power control module assembly constructed in accordance with the disclosure is shown in FIG. 1 and is designated generally by reference character 100. Other embodiments of power control module assemblies in accordance with the disclosure, or aspects thereof, are provided in FIG. 2, as will be described. The systems and methods described herein can be used to improve heat dissipation and ease of manufacturing of power control modules, e.g. Solid State Power Controller (SSPC) modules, such as those used in aircraft power distribution systems. The resulting power control module assembly provides about 40% more printed wiring board (PWB) area to accommodate for more power devices, e.g. a single PWB can include 40-50 power devices, and can provide improved current limiting during current inrush events as compared with traditional power control module assemblies that have power devices directly mounted on the PWB. Moreover, embodiments of the present disclosure result in about 40% more power dissipation per module, as compared with traditional modules that use the PWB for heat dissipation.

As shown in FIGS. 1-2, a power control module assembly 100 includes a plurality of power control modules 101. Each power control module 101 includes a power device 102, e.g. a semiconductor device, such as metal-oxide-semiconductor field-effect transistors (MOSFETs), having a first side 104 and a second side 106. Second side 106 is opposite from the first side 104 and includes a metallic tab 117 of the MOSFET inlaid therein. In FIG. 1, metallic tab 117 is shown in the center MOSFET 102, however, those skilled in the art will readily appreciate that the right and left side MOSFETs, and any others included in the assembly 100 would also have a similar configuration. Each transistor 102 is packaged as an ISOTAB MOSFET 102, e.g. where the drain is electrically isolated from the metallic tab 117 of the MOSFET 102. Those skilled in the art will readily appreciate that while transistor 102 is shown and described as an ISOTAB MOSFET, there are a variety of suitable semiconductor power devices that may be used for assembly 100. Power control module assembly 100 includes a PWB 108 spaced apart from each first side 104 of each MOSFET 102. PWB 108 is electrically connected to each MOSFET 102 by way of a source lead 116, a drain lead 118 and a gate lead 120. From the side view of FIG. 1, only gate leads 120 of the MOSFETs 102 are visible. In the view of FIG. 2, however, a respective MOSFET 102 is shown from its first side 104 and PWB 108 is not shown so that source lead 116, and drain lead 118 of the respective MOSFET 102 are also visible. Leads 116, 118 and 120 are bent upward and out of the page, away from the direction that an outer surface 115 of the tab 117 of MOSFET 102 faces. This is the opposite from standard leads, which are typically bent to longitudinally extend in the same direction that the tab surface faces. Those skilled in the art will readily appreciate that the side profile for source and drain leads 116 and 118, respectively, would be similar to that of gate lead 120 and would be soldered to PWB 108 in a similar manner. PWB 108 includes a plurality of control circuit channels, where each channel corresponds to at least one of the MOSFETs 102 to form a respective power control module 101.

With continued reference to FIG. 1, assembly 100 includes a heat sink plate, e.g. a copper plate heat sink 110, parallel to the main PWB 108 with all the power MOSFETs 102 mounted on it. Copper plate heat sink 110 is soldered to the second side 106 of each MOSFET 102 for heat dissipation from MOSFETs 102. The metallic tab 117 is inlaid within the bottom surface of second side 106 and outer surface 115 of the metallic tab 117 faces copper plate heat sink 110. Metallic tab 117 is connected to copper plate heat sink 110 by way of the solder to dissipate heat from the MOSFET 102 to the heat sink 110. This is schematically indicated by solder material 105. Copper plate heat sink 110 can be coupled to an aluminum chassis of the assembly by way of a wedge lock coupling. Copper plate heat sink 110 includes plate access holes 112 defined therethrough to allow for soldering access by a soldering tip 124 to each respective MOSFET 102 during assembly, which is described in more detail below. For clarity, a portion of copper plate heat sink 110 are broken away and shown in cross-section to show access holes 112 and soldering tip 124 extending through the middle access hole 112. Each plate access hole 112 is aligned with a second side 106 of a respective MOSFET 102.

As shown in FIG. 1, PWB 108 includes PWB access holes 114 defined therethrough to allow a push pin 122 to extend through PWB 108 during assembly. For clarity, a portion of PWB 108 is broken away and shown in cross-section to show an access hole 114 and push pin 122 extending therethrough. Push pin 122, as described in more detail below, is used to hold one of the MOSFETs 102 in place against copper plate heat sink 110 during soldering. Each PWB access hole 114 is aligned with first side of a respective MOSFET 102. PWB access holes 114 and plate access holes 112 approximately face towards one another across their respective MOSFETs 102. PWB access holes 114 each define a respective central axis A and PWB access holes 114 and plate access holes 112 are aligned such that each central axis A extends through the corresponding plate access hole 112. While only a single soldering tip 124 and a single push pin 122 are shown, those skilled in the art will readily appreciated that the automated machinery can operate in a step and repeat operation in order to solder multiple MOSFETs 102, as described below, or can include multiple soldering tips and push pins in order to solder more than one MOSFET 102 to copper plate 110 at a given time. An automated configuration with multiple soldering tips and push pins can also operate in a step and repeat operation, e.g. soldering two or more MOSFETs at a given time and then moving onto another set of MOSFETs.

With continued reference to FIG. 1, a method of assembling a power control module assembly, e.g. assembly 100, includes forming the source, drain and/or gate lead, e.g. source lead 116, drain lead 118 and gate lead 120, of a given transistor, e.g. MOSFET 102, by bending at least one of the leads toward a PWB, e.g. PWB 108. The method includes prepping the PWB by forming respective PWB access holes, e.g. PWB access holes 114, for each transistor in the PWB. Those skilled in the art will readily appreciate that the PWB and its access holes are typically manufactured before any assembly is started. The method includes aligning each transistor with its respective PWB access hole. The method includes electrically connecting at least one of the leads for each of the transistors to the PWB by soldering. Solder material is indicated schematically by solder 107. A portion of PWB 108 (on the right-hand side as oriented in FIG. 1) is shown in cross-section to show the solder 107 connection between lead 120 and PWB. Assembly 100, shown in FIG. 1, is assembled by using an automated machine which includes a push pin, e.g. push pin 122, and a soldering tip, e.g. soldering tip 124.

As shown in FIG. 1, the method can include aligning the PWB access hole with its corresponding plate access hole, and/or the method includes moving at least one of the PWB or the copper plate heat sink with the automated X-Y table to align at least one of the PWB access hole or the plate access hole with the push pin and/or the soldering tip. Automated X-Y table 126 is schematically shown in FIG. 1 and those skilled in the art will readily appreciate that X-Y table 126 may have a variety of configurations to permit movement relative to push pin 122 and/or soldering tip 124.

Once aligned, the method includes pushing the transistor toward and against a copper plate heat sink, e.g. copper plate heat sink 110, with the automated push pin from a first side of the transistor, e.g. first side 104. The push pin is inserted through the PWB access hole. The method includes accessing a second side, e.g. second side 106, of the transistor by inserting the soldering tip through a plate access hole, e.g. copper plate access hole 112. While the push pin is pushing the transistor against the copper plate heat sink from the first side, the automated soldering tip solders the second side of the transistor to the copper plate heat sink through the plate access hole. Once the soldering is completed, the soldering tip and push pin are retracted out of their respective access holes. Then, an X-Y table, e.g. X-Y table 126, moves the board to the next location, e.g. the access holes on the PWB and copper plate corresponding to the next unsoldered transistor. The pushing towards the PWB and the soldering to the copper plate is then repeated for each transistor. Once all of the transistors are soldered to the copper plate, or even in between soldering steps, assembly 100 can be cleaned.

This method of mounting the power MOSFETs on copper plate 112 can result in at least a 40% increase in thermal dissipation by assembly 100 and allows more board area on the PWB for additional SSPC circuit channels. The large shared thermal resource (e.g. the copper plate heat sink) easily consumes thermal transients from lightning and inductive clamping and, due to the increase in thermal dissipation, even allows for short term current limiting during inrush and overload events.

The methods and systems of the present disclosure, as described above and shown in the drawings provide for power control modules with superior properties including increased heat dissipation, more efficient manufacturing and capability to include more power devices in a module. While the apparatus and methods of the subject disclosure have been shown and described with reference to certain embodiments, those skilled in the art will readily appreciate that change and/or modifications may be made thereto without departing from the scope of the subject disclosure.

What is claimed is:

1. A power control module comprising:
a transistor having a first side and a second side opposite from the first;
a printed wiring board (PWB) spaced apart from the first side of the transistor, wherein the PWB is electrically connected to the transistor; and
a heat sink plate soldered to a second side of the transistor for heat dissipation from the transistor, wherein the PWB includes a PWB access hole defined in the PWB to allow for access to the transistor during assembly, and wherein the heat sink plate includes a plate access hole defined therein.

2. The power control module of claim 1, wherein the plate access hole allows for soldering access during assembly.

3. The power control module of claim 2, wherein the plate access hole is aligned with the second side of the transistor.

4. The power control module of claim 1, wherein the PWB access hole is aligned with the first side of the transistor.

5. The power control module of claim 1, wherein the PWB access hole and the plate access hole face towards one another across the transistor.

6. The power control module of claim 5, wherein the PWB access hole defines a central axis and wherein the PWB access hole and the plate access hole are aligned such that the central axis of the PWB access hole extends through the plate access hole.

7. The power control module of claim 1, wherein the transistor is electrically connected to the PWB by at least one of a drain lead, a source lead or a gate lead.

8. The power control module of claim 1, wherein the transistor is an ISOTAB transistor.

\* \* \* \* \*